US012701698B2

(12) United States Patent
Li et al.

(10) Patent No.: US 12,701,698 B2
(45) Date of Patent: Aug. 4, 2026

(54) 3D MEMORY DEVICE, MEASUREMENT METHOD THEREOF, AND FILM MEASUREMENT DEVICE

(71) Applicant: YANGTZE MEMORY TECHNOLOGIES CO., LTD., Wuhan (CN)

(72) Inventors: Fengrui Li, Wuhan (CN); Shuo Zhang, Wuhan (CN); Yuanxiang Zou, Wuhan (CN); Wei Zhang, Wuhan (CN); Yi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 620 days.

(21) Appl. No.: 18/092,075

(22) Filed: Dec. 30, 2022

(65) Prior Publication Data

US 2023/0157014 A1      May 18, 2023

Related U.S. Application Data

(63) Continuation of application No. PCT/CN2022/070581, filed on Jan. 6, 2022.

(30) Foreign Application Priority Data

Feb. 3, 2021    (CN) .......................... 202110147527.7

(51) Int. Cl.
| | |
|---|---|
| *H10B 41/27* | (2023.01) |
| *G01B 11/06* | (2006.01) |
| *H10B 43/35* | (2023.01) |

(52) U.S. Cl.
CPC ............. *H10B 41/27* (2023.02); *G01B 11/06* (2013.01); *H10B 43/35* (2023.02)

(58) Field of Classification Search
CPC ............................... H10B 43/27; H10B 43/20
See application file for complete search history.

(56) References Cited

U.S. PATENT DOCUMENTS

| | | | |
|---|---|---|---|
| 8,860,937 B1 | 10/2014 | Dziura et al. | |
| 2017/0235232 A1 | 8/2017 | Toshima et al. | |
| 2019/0103410 A1 | 4/2019 | Daycock et al. | |
| 2021/0126008 A1* | 4/2021 | Tanabe | H10D 30/683 |

FOREIGN PATENT DOCUMENTS

| | | |
|---|---|---|
| CN | 107816949 A | 3/2018 |
| CN | 108461503 A | 8/2018 |
| CN | 109712987 A | 5/2019 |
| CN | 110876279 A | 3/2020 |
| CN | 111199979 A | 5/2020 |
| CN | 111244103 A | 6/2020 |
| CN | 111276414 A | 6/2020 |
| CN | 111276416 A | 6/2020 |
| CN | 111293052 A | 6/2020 |
| CN | 112786603 A | 5/2021 |

OTHER PUBLICATIONS

International Search Report issued in corresponding International Application No. PCT/CN2022/070581, mailed on Mar. 14, 2022, 6 pages.

* cited by examiner

*Primary Examiner* — Christopher A Johnson
(74) *Attorney, Agent, or Firm* — BAYES PLLC

(57) ABSTRACT

A three-dimensional (3D) memory device includes a stack structure including a first stack structure and a second stack structure over the first stack structure, and a barrier layer disposed in a first channel hole in the first stack structure.

15 Claims, 8 Drawing Sheets

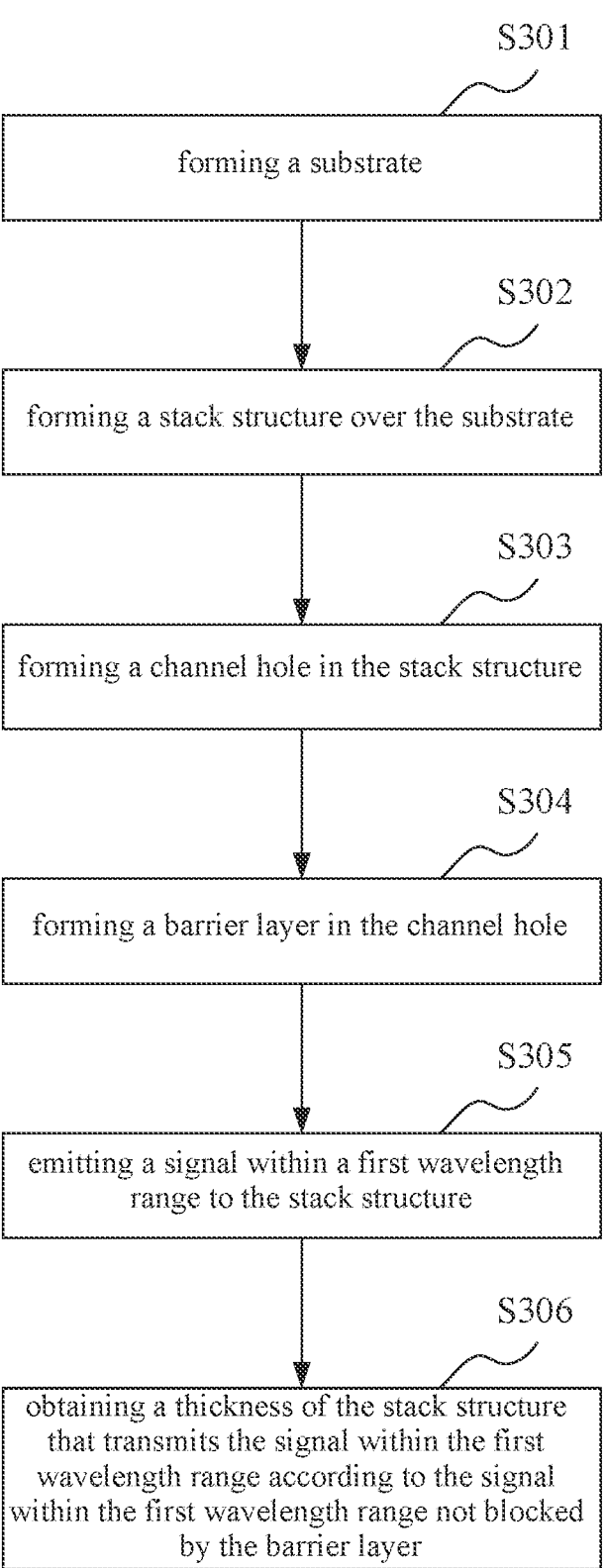

S301 forming a substrate

S302 forming a stack structure over the substrate

S303 forming a channel hole in the stack structure

S304 forming a barrier layer in the channel hole

S305 emitting a signal within a first wavelength range to the stack structure

S306 obtaining a thickness of the stack structure that transmits the signal within the first wavelength range according to the signal within the first wavelength range not blocked by the barrier layer

Fig. 3

3D MEMORY DEVICE, MEASUREMENT METHOD THEREOF, AND FILM MEASUREMENT DEVICE

CROSS-REFERENCE TO RELATED APPLICATIONS

This application is a continuation of International Application No. PCT/CN2022/070581, filed on Jan. 6, 2022, which claims the benefit of priority to Chinese Application No. 202110147527.7 filed on Feb. 3, 2021, both of which are incorporated herein by reference in their entireties.

TECHNICAL FIELD

The present disclosure relates to the field of a semiconductor device, particularly to a 3D memory device, a measurement method thereof, and a film measurement device.

BACKGROUND

With the feature size of semiconductor manufacturing processes becoming smaller and smaller, the storage density of memory devices becomes higher and higher. In order to further improve the storage density, a memory device with a three-dimensional structure (namely a 3D memory device) has been developed. The 3D memory device comprises a plurality of memory cells stacked along a vertical direction, which can increase an integration degree exponentially on unit area of wafer and can reduce costs.

In order to increase the density of a 3D memory device (3D NAND memory device), the number of stacked layers becomes increasingly larger such as a dual deck, and the film thickness increases exponentially accordingly. Meanwhile, the channel hole needs two etches rather than one etch. The film thickness imposes an important influence on the structure and electrical performance of devices and therefore requires strict on-line monitoring in the manufacturing process. However, the increasingly thicker films bring about a big challenge for film thickness measurement methods. Not only front-end process variations or fluctuations might disturb subsequent film measurement, but also it is impossible to distinguish whether the front-end process or the current station results in the variation. Therefore, it is possible to result in an unreasonable deviation between the calculated results and the practical process results.

SUMMARY

The present disclosure provides a 3D memory device comprising a substrate; a stack structure over the substrate for forming a memory array; a channel hole disposed in the stack structure; and a barrier layer disposed in the channel hole for blocking a signal within a first wavelength range. In some implementations, the barrier layer penetrates through at least a part of the stack structure.

In some implementations, the stack structure comprises: a first stack structure over the substrate for forming a memory array; a second stack structure over the first stack structure for forming the memory array; the channel hole comprising: a first channel hole disposed in the first stack structure, wherein, the barrier layer is disposed in the first channel hole.

In some implementations, the barrier layer is a sacrificial layer remained after a front-end process.

The present disclosure further provides a measurement method for a 3D memory device, comprising: forming a substrate; forming a stack structure over the substrate; forming a channel hole in the stack structure; forming a barrier layer in the channel hole for blocking a signal within a first wavelength range; emitting the signal within the first wavelength range to the stack structure; and obtaining a thickness of the stack structure that transmits the signal within the first wavelength range according to the signal within the first wavelength range not blocked by the barrier layer.

In some implementations, the forming a stack structure over the substrate; the forming a channel hole in the stack structure comprises: forming a first stack structure over the substrate; forming a first channel hole in the first stack structure; forming the barrier layer in the first channel hole; and forming a second stack structure on the first stack structure; the obtaining a thickness of the stack structure that transmits the signal within the first wavelength range according to the signal within the first wavelength range not blocked by the barrier layer comprises: obtaining a thickness of the second stack structure according to the signal within the first wavelength range not blocked by the barrier layer.

In some implementations, the forming the barrier layer in the first channel hole comprises: filling a sacrificial layer in the first channel hole, wherein at least a part of the sacrificial layer is configured to form the barrier layer.

In some implementations, the measurement method comprises: stacking a first stack structure over the substrate; opening a first channel mask to etch a first channel hole in the first stack structure; stacking a second stack structure over the first stack structure, and the first channel hole; opening a second channel mask and closing the first channel mask to etch a second channel hole in the second stack structure; and opening the first channel mask and closing the second channel mask to clean the completed device.

In some implementations, the forming the stack structure over the substrate comprises: depositing a plurality of sacrificial layers and a plurality of interlayer insulating layers alternatively over the substrate to form the stack structure.

In some implementations, the forming the stack structure over the substrate comprises: forming a first stack structure over the substrate; for stack structures over the first stack structure, forming a latter stack structure over a former stack structure; the measurement method further comprising: measuring a thickness of the former stack structure after forming the former stack structure; and measuring a thickness of the latter stack structure after forming the latter stack structure.

In some implementations, an incident angle of the signal within the first wavelength range is calculated and obtained according to a spacing between the adjacent barrier layers.

In some implementations, an incident location of the signal within the first wavelength range includes a location of the channel hole.

The present disclosure further provides a film measurement device for measuring a thickness of a film in the afore-mentioned 3D memory device. The film measurement device comprises: an optics critical dimension measurement device configured to measure a film of the 3D memory device to be measured to obtain a measurement spectrum; and a processor configured to obtain a thickness of the film to be measured according to the measurement spectrum.

BRIEF DESCRIPTION OF DRAWINGS

The above and other objects, features, and advantages of the present disclosure will become clearer through the description of implementations of the present disclosure below with reference to accompanying drawings, in which:

FIG. 3 shows a flow chart of a measurement method for a 3D memory device according to the first implementation of the present disclosure;

DETAILED DESCRIPTION

Figure 1:
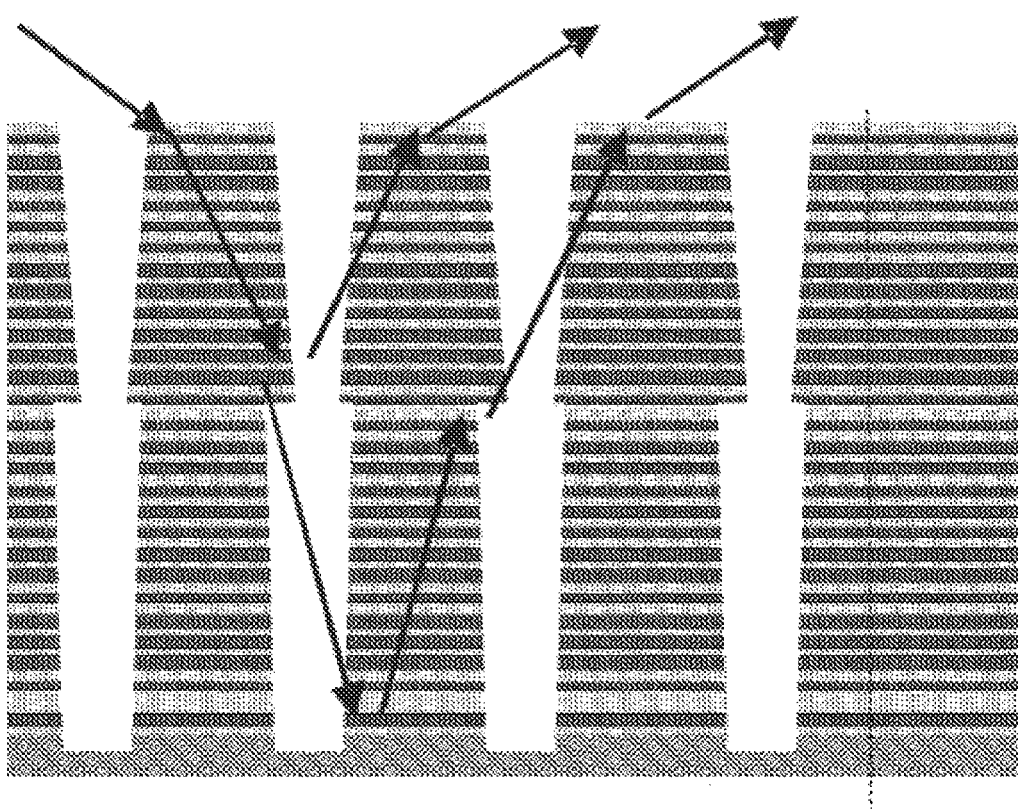
FIG. 1 shows a structure of a 3D memory device and a principle of a film thickness measurement.

Hereinafter, various implementations of the present disclosure will be described in more detail with reference to accompanying drawings. In the drawings, the same elements are denoted with the same or similar reference numerals. For clarity, various parts in the drawings are not drawn to scale. Furthermore, some known parts may not be shown in drawings.

The specific implementations of the present disclosure will be further described in detail below with reference to drawings and implementations. Numerous specific details of the present disclosure are described below, such as structures, materials, sizes, processes, and technologies of components, in order to understand the present disclosure more clearly. However, as understood by those skilled in the art, it is possible to implement the present disclosure without these specific details.

It will be appreciated that while describing a structure of a component, when a layer or region is said to be "on" or "over" another layer or region, it may be directly on another layer or region, or there may be other layers or regions between the layer or region and another layer or region. Furthermore, if the component is reversed, the layer or region will be "under" or "beneath" another layer or region.

In order to increase the bit density of a 3D NAND memory device, the number of stacked layers becomes increasingly larger such as a dual deck, and the film thickness increases exponentially accordingly. Meanwhile, channel holes need two etches rather than one etch. The film thickness imposes an important influence on the structure and electrical performance of devices and therefore requires strict on-line monitoring in the manufacturing process.

The inventors have found that the increasingly thicker films bring about a big challenge for film thickness measurement methods. Front-end process variations or fluctuations might disturb a subsequent film measurement. Film measurement based on a regression algorithm can not avoid inter-linkages among multiple variables, and can't distinguish whether the front-end process or the current station results in the variation. Therefore, it is possible to result in an unreasonable deviation between the calculated results and the practical process results. Also, with a further increase in the film thickness, this problem will become more and more serious and can cause the confidence level of measurement results to be reduced. In addition, due to the loading effect caused by the pattern density, it may be impossible to accurately reflect the real condition of a film thickness (such as the film thickness of the core array) by the measurement pad. FIG. 1 shows a structure of a 3D memory device and a principle of a film thickness measurement. As shown in FIG. 1, the existing 3D memory device is of a stack structure. While performing a thickness measurement, a measurement signal is sent, but a plurality of feedback signals may be obtained, thereby resulting in an inaccurate measurement of a film thickness.

The inventors also have found that with the increase in the thickness of a 3D NAND memory, process steps increase accordingly, and film thickness monitoring becomes more and more critical. For the current regression method and machine for film thickness measurement, due to the limitations of principle, algorithm, and hardware, challenges such as model reliability arise while establishing a measurement site on an upper deck array, and risks such as an insufficient capacity or even failure might occur in the future while the device thickness increases. At the dual-deck site, for a pure film pad, its front-end process results, especially the completed lower deck, will impact the current measurement spectrum severely. Due to the similar materials, upper deck and lower deck films are highly interlinked from a modeling perspective, which makes it impossible to properly distinguish sources of information in original measurement data with the modeling. And at present, there is no effective means to block the influence of front-end process on the present site being measured in terms of signal. For the loading effect caused by the pattern density difference, it may be impossible to accurately reflect the real condition of the film thickness of the core array with the pure film pad result.

Figure 2:
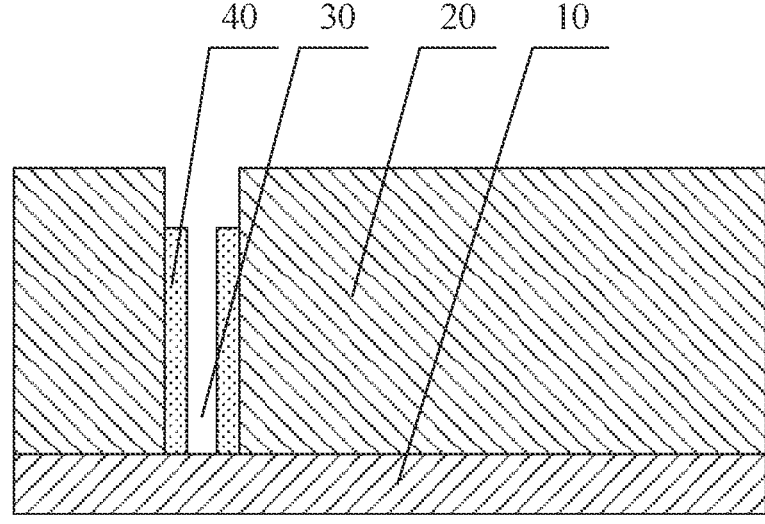
FIG. 2 shows a schematic diagram of a structure of a 3D memory device according to a first implementation of the present disclosure.

FIG. 2 shows a schematic diagram of a structure of a 3D memory device according to an implementation of the present disclosure. As shown in FIG. 2, the 3D memory device according to an implementation of the present disclosure comprises a substrate 10, a stack structure 20, a channel hole 30, and a barrier layer 40. Specifically, the substrate 10 may be, for example, a semiconductor substrate. The stack structure 20 over the substrate 10 is configured to form a memory array. The channel hole 30 is disposed in the stack structure 20. The barrier layer 40 is disposed in the channel hole 30 for blocking a signal within a first wavelength range. Optionally, the first wavelength range is a short wavelength range.

In an optional implementation of the present disclosure, the barrier layer 40 penetrates at least a part of the stack structure. Optionally, the barrier layer 40 is disposed on the sidewalls of the channel hole 30.

FIG. 3 shows a flow chart of a measurement method for a 3D memory device according to a first implementation of the present disclosure. As shown in FIG. 3, the measurement method for the 3D memory device according to the first implementation of the present disclosure comprises the following steps.

At step S301, a substrate is formed. The substrate is formed. For example, a semiconductor substrate is formed as the substrate for the 3D memory device.

At step S302, a stack structure is formed over the substrate. The stack structure is formed over the substrate for forming the memory array. Optionally, a plurality of sacrificial layers and a plurality of interlayer insulating layers are deposited alternatively over the substrate to form the stack structure.

At step S303, a channel hole is formed in the stack structure. The channel hole is formed in the stack structure. For example, the channel hole is etched in the stack structure.

At step S304, a barrier layer is formed in the channel hole. The barrier layer is formed in the channel hole for blocking a signal within a first wavelength range. For example, the barrier layer is formed on the sidewalls of the channel hole.

At step S305, the signal within the first wavelength range is emitted to the stack structure. The signal within the first wavelength range is emitted towards the stack structure.

At step S306, the thickness of the stack structure transmitting the signal within the first wavelength range is obtained according to the signal within the first wavelength range not blocked by the barrier layer.

The thickness of the stack structure that transmits the signal within the first wavelength range is obtained according to the signal within the first wavelength range that is not blocked by the barrier layer. Specifically, the signal within the first wavelength range is emitted to the stack structure. The signal within the first wavelength range having a transmission path passing through the barrier layer will be blocked; while the signal within the first wavelength range having a transmission path not passing through the barrier layer will not be blocked. It is possible to obtain the thickness of the stack structure that transmits the signal within the first wavelength range according to the signal within the first wavelength range that is not blocked by the barrier layer. Optionally, the signal within the first wavelength range is emitted to the stack structure, and a thickness of a part of the stack structure without a barrier layer (a thickness of the stack structure with the thickness of the barrier layer excluded) is obtained according to the received reflection signal.

In an optional implementation of the present disclosure, forming the stack structure over the substrate comprises forming a first stack structure over the substrate; and for stack structures over the first stack structure, forming a latter stack structure over a former stack structure, that is, forming successively a second stack structure, a third stack structure . . . over the first stack structure. After forming the former stack structure, the thickness of the former stack structure is measured; and after forming the latter stack structure, the thickness of the latter stack structure is measured. Optionally, after forming the former stack structure and measuring the thickness of the stack structure, a barrier layer is formed in the former stack structure. After forming the barrier layer in the former stack structure, the latter stack structure is formed on the former stack structure, and the thickness of the latter stack structure is measured.

In an optional implementation of the present disclosure, an incident angle of the signal within the first wavelength range is calculated and obtained according to the spacing between adjacent barrier layers. Optionally, the stack structure comprises a first stack structure and a second stack structure over the first stack structure. A plurality of barrier layers are provided in the first stack structure. The incident angle of the signal within the first wavelength range is calculated and obtained according to the spacing between adjacent barrier layers such that the signal within the first wavelength range is blocked from being incident into the first stack structure to accurately measure the thickness of the second stack structure.

In an optional implementation of the present disclosure, an incident location of the signal within the first wavelength range includes the location of the channel hole (barrier layer). Optionally, the channel hole (barrier layer) is located in the transmission path of the signal within the first wavelength range.

In an optional implementation of the present disclosure, the measurement method for the 3D memory device further comprises filling a sacrificial layer in the channel hole. At least a part of the sacrificial layer is configured to form the barrier layer.

In an optional implementation of the present disclosure, the location, depth, diameter etc. of the first channel hole may be determined according to practical demands to form barrier layers at different locations. The barrier layer can block a signal within a short (first) wavelength range such that the thickness at the location of the barrier layer can not be measured, thereby accurately measuring the thickness of the film to be measured.

Figure 4:
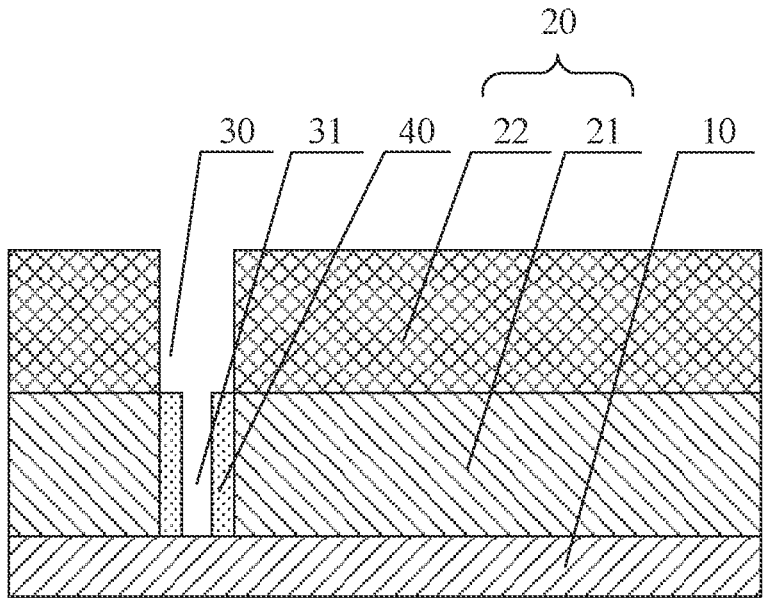
FIG. 4 shows a schematic diagram of a structure of a 3D memory device according to a second implementation of the present disclosure.

FIG. 4 shows a schematic diagram of a structure of a 3D memory device according to a second implementation of the present disclosure. As shown in FIG. 4, the 3D memory device according to the second implementation of the present disclosure comprises a substrate 10, a stack structure 20, a channel hole 30, and a barrier layer 40. The stack structure 20 comprises a first stack structure 21 and a second stack structure 22. The channel hole 30 comprises a first channel hole 31.

Specifically, the substrate 10 may be, for example, a semiconductor substrate. The first stack structure 21 over the substrate 10 is configured to form a memory array. The second stack structure 22 over the first stack structure 21 is configured to form the memory array. The first channel hole 31 is disposed in the first stack structure 21. The barrier layer 40 is disposed in the first channel hole 31.

In an optional implementation of the present disclosure, the channel hole 30 comprises the first channel hole 31 and a second channel hole (not shown). The second channel hole is disposed in the second stack structure. Optionally, the first channel hole 31 and the second channel hole are connected. That is, the first channel hole 31 and the second channel hole communicate with each other. Optionally, the axis of the first channel hole 31 and the axis of the second channel hole coincide with each other.

In an optional implementation of the present disclosure, the 3D memory device according to an implementation of the present disclosure further comprises a barrier layer above the first stack structure and below the second stack structure. In the implementation, the barrier layer is formed directly between the two stack structures (the first and second stack structures), which can block all signals from being incident into the first stack structure (for example, the bottom stack layer).

In an optional implementation of the present disclosure, the stack structure is not limited to the dual stack, and may have more stacks. That is, there may further be a third stack structure, a fourth stack structure, a fifth stack structure . . . over the second stack structure. Optionally, after forming the first stack structure, the thickness of the first stack structure is measured; after forming the second stack structure, the thickness of the second stack structure is measured; . . . ; and this operation is repeated if there are more stack structures to calculate the thickness of all the stack structures. Optionally, a barrier layer is provided between two adjacent stack structures. Optionally, after forming the first stack structure, the thickness of the first stack structure is measured, and a barrier layer is then formed on the first stack structure; after forming the second stack structure, the thickness of the second stack structure is measured, and a barrier layer is then formed on the second stack structure; . . . ; and the above operation is repeated if there are more stack structures.

In an optional implementation of the present disclosure, the barrier layer is the sacrificial layer remained after the front-end process.

Figure 5:
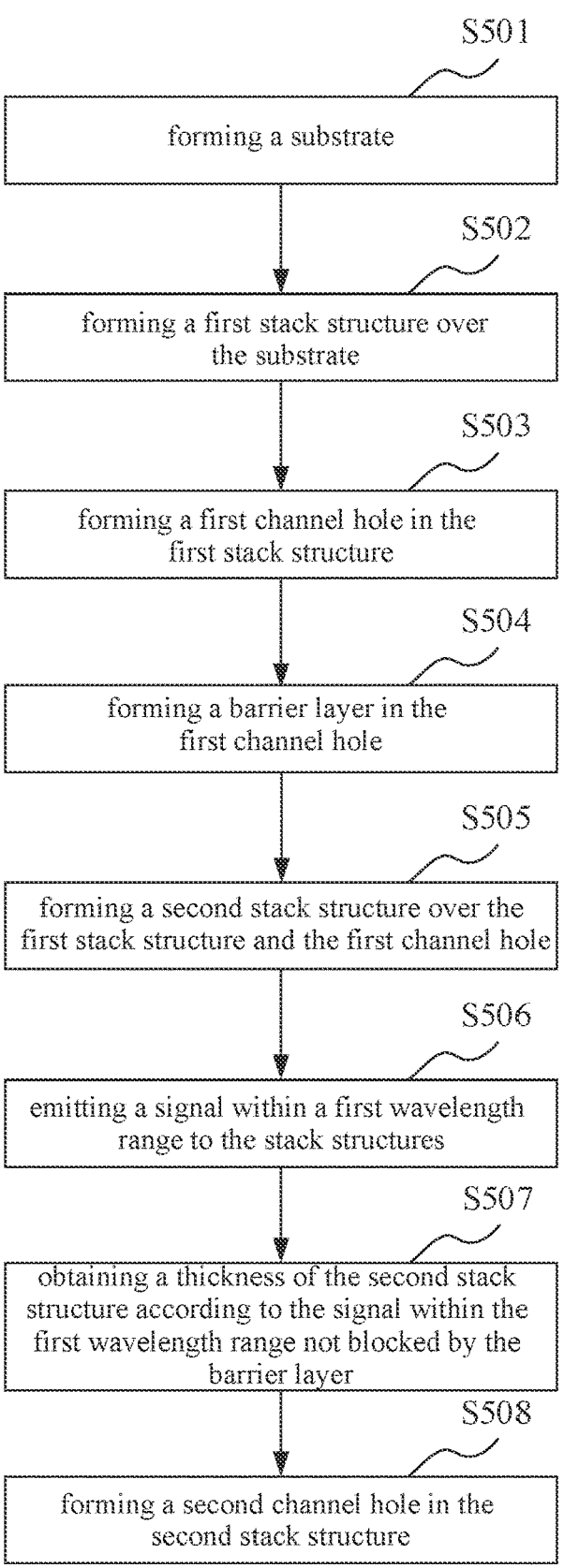
FIG. 5 shows a flow chart of a measurement method for a 3D memory device according to a second implementation of the present disclosure.
Figure 6:
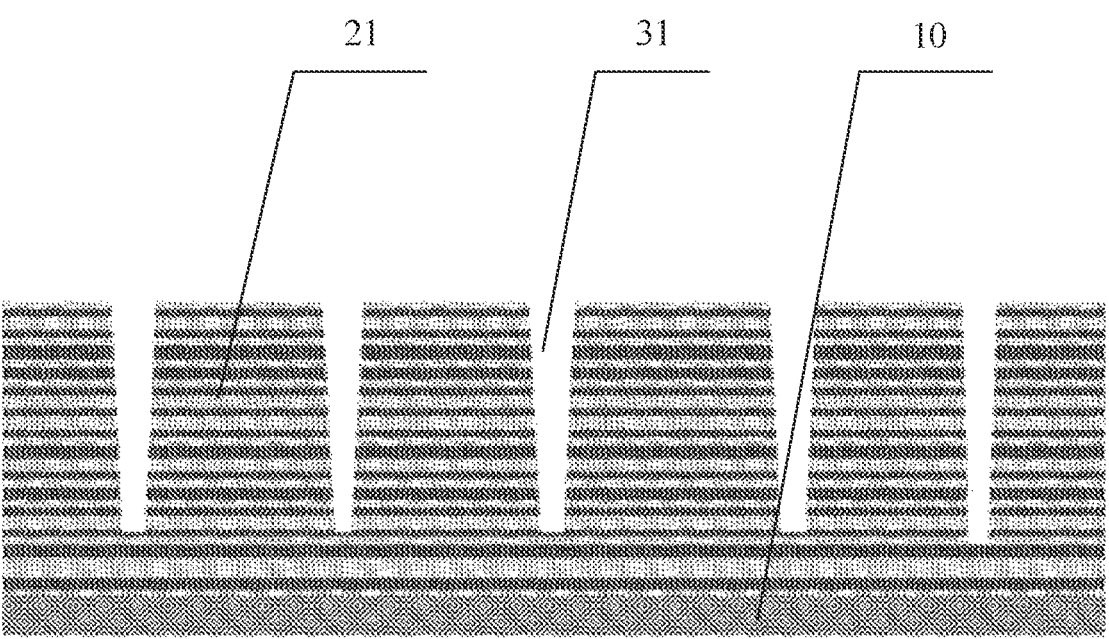
FIGS. 6 to 8 show schematic sectional diagrams of stages in the measurement method for the 3D memory device according to the second implementation of the present disclosure.
Figure 7:
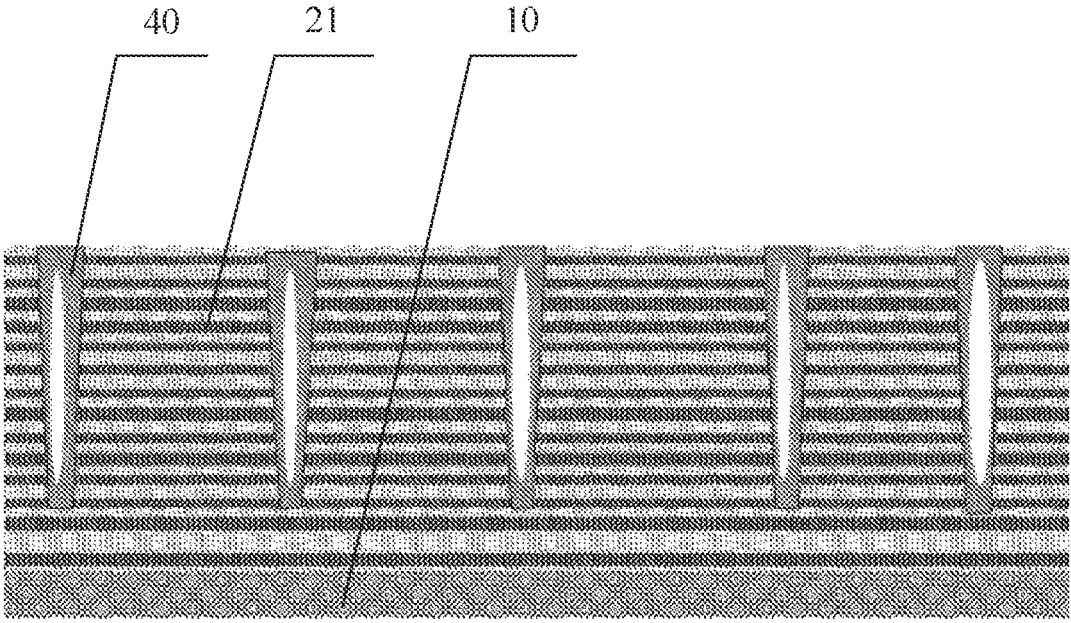
Figure 8:
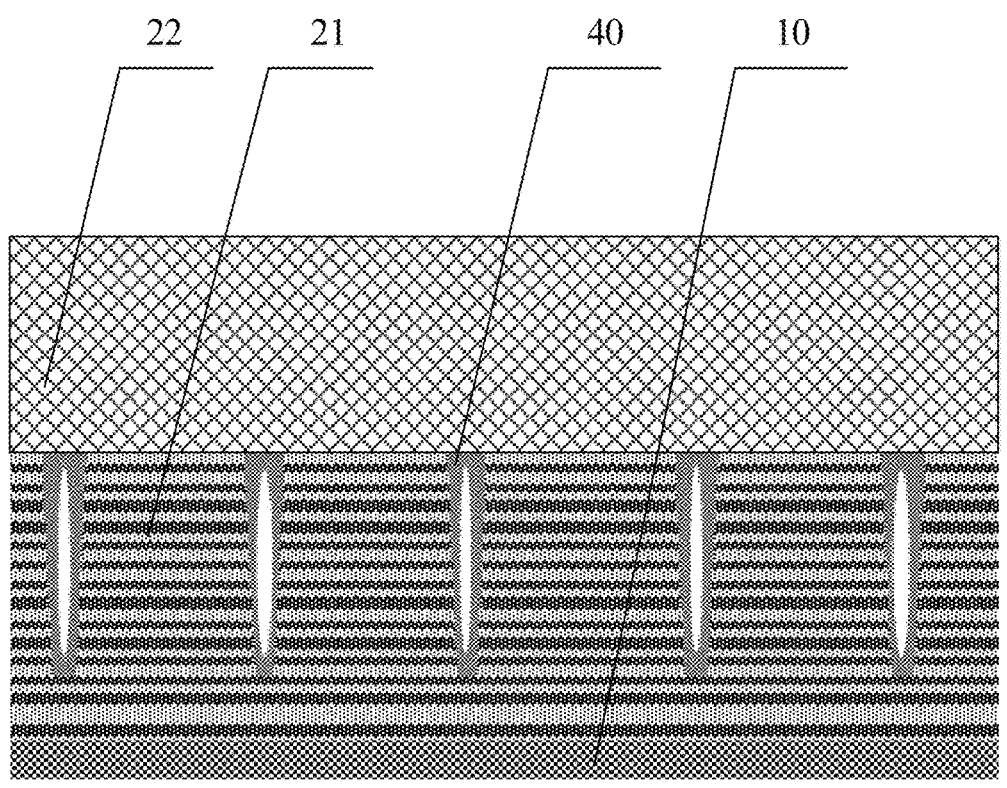

FIG. 5 shows a flow chart of a measurement method for a 3D memory device according to a second implementation of the present disclosure. FIGS. 6 to 8 show schematic sectional diagrams of stages in the measurement method for the 3D memory device according to the second implementation of the present disclosure. As shown in FIG. 5, the measurement method for the 3D memory device according to the second implementation of the present disclosure comprises the following steps.

At step S501, a substrate is formed. The substrate is formed. For example, a semiconductor substrate is formed as the substrate for the 3D memory device.

At step S502, a first stack structure is formed over the substrate. The first stack structure is formed over the substrate for forming a memory array. Optionally, a plurality of sacrificial layers and a plurality of interlayer insulating layers are deposited alternatively over the substrate to form the first stack structure. Optionally, a monitor pad is formed over the substrate as the first stack structure. The monitor pad is, for example, located at the scribing line on the wafer. The films, structures, etc., on the scribing line may be consistent or inconsistent with the core array. Optionally, consistency or inconsistency of films, structures, etc., on the scribing line with the core array may be achieved by controlling ON (developing) or OFF (not developing) of the mask. At step S503, a first channel hole is formed in the first stack structure.

The first channel hole is formed in the first stack structure. For example, the first channel hole is etched in the first stack structure. Optionally, the first stack structure is etched to form the first channel hole penetrating through the first stack structure. Optionally, the first channel hole extends to the substrate and a silicon groove is formed inside the substrate.

As shown in FIG. 6, a first stack structure 21 is formed over a substrate 10. A first channel hole 31 is disposed in the first stack structure 21. For example, at least one first channel hole is formed in the first stack structure 21 by a first etch, such as a lower channel etch. Optionally, the first stack structure 21 further comprises gate lines. As shown in FIG. 6, a plurality of sacrificial layers and a plurality of interlayer insulating layers are deposited alternatively over the substrate 10 to form the first stack structure 21.

At step S504, a barrier layer is formed in the first channel hole.

The barrier layer is formed in the first channel hole. For example, the barrier layer is formed on the sidewalls of the first channel hole. As shown in FIG. 7, the barrier layer 40 is filled in the first channel hole 31. In an optional implementation of the present disclosure, a sacrificial layer is filled in the first channel hole 31. At least a part of the sacrificial layer is configured to form the barrier layer 40. Optionally, a sacrificial layer (SAC Poly-Si or Carbon) is filled in the first channel hole 31 as the barrier layer 40.

At step S505, a second stack structure is formed over the first stack structure and the first channel holes.

The second stack structure is stacked over the first stack structure and the first channel holes for forming the memory array. Optionally, a plurality of sacrificial layers and a plurality of interlayer insulating layers are deposited alternatively over the first stack structure and the first channel holes to form the second stack structure.

As shown in FIG. 8, a second stack structure 22 is formed over the first stack structure 21 and the first channel holes 31 (upper film deposition). The barrier layer 40 remained in the first stack structure 21 (SAC Poly-Si(Carbon) remains untouched on the monitor pad). Optionally, the monitor pad (the first stack structure) is, for example, located at the scribing line on the wafer. The films, structures, etc., on the scribing line may be consistent or inconsistent with the core array. Optionally, consistency or inconsistency of films, structures, etc., on the scribing line with the core array may be achieved by controlling ON (developing) or OFF (not developing) of the mask.

At step S506, a signal within a first wavelength range is emitted to the stack structures.

The signal within the first wavelength range is emitted to the stack structures (the first stack structure and the second stack structure).

At step S507, a thickness of the second stack structure is obtained according to the signal within the first wavelength range that is not blocked by the barrier layer.

The thickness of the second stack structure is obtained according to the signal within the first wavelength range (i.e., the signal within the first wavelength range emitted to the stack structure and reflected by the stack structure) that is not blocked by the barrier layer. In an optional implementation of the present disclosure, the measurement method for the 3D memory device further comprises:

At step S508, a second channel hole is formed in the second stack structure.

The second channel hole is formed in the second stack structure. For example, the second channel hole is etched in the second stack structure. Optionally, the second stack structure is etched to form the second channel hole penetrating through the second stack structure. Optionally, the second channel hole extends to the upper surface of the first stack structure.

In an optional implementation of the present disclosure, a first stack structure is formed over the substrate, and a first pillar penetrating through the first stack structure is formed. A second stack structure is formed on the first stack structure, and a second pillar penetrating through the second stack structure is formed. At least a part of the first pillar and the second pillar is removed to form the first channel hole and the second channel hole. Optionally, the axis of the first channel hole and the axis of the second channel hole coincide with each other.

In an optional implementation of the present disclosure, a first stack structure and a second stack structure are successively formed over the substrate. A first channel hole is disposed in the first stack structure; and a second channel hole is disposed in the second stack structure. The second channel hole and the first channel hole are staggered in the horizontal direction. Optionally, the first channel hole and the second channel hole do not communicate with each other.

In an optional implementation of the present disclosure, in the front-end process, the barrier layer is disposed in the (first) channel hole. Regardless of how the front-end process varies, the barrier layer is always disposed in the (first)

channel hole. Therefore, variation of the front-end process will not impact the subsequent measurement.

Figure 9:
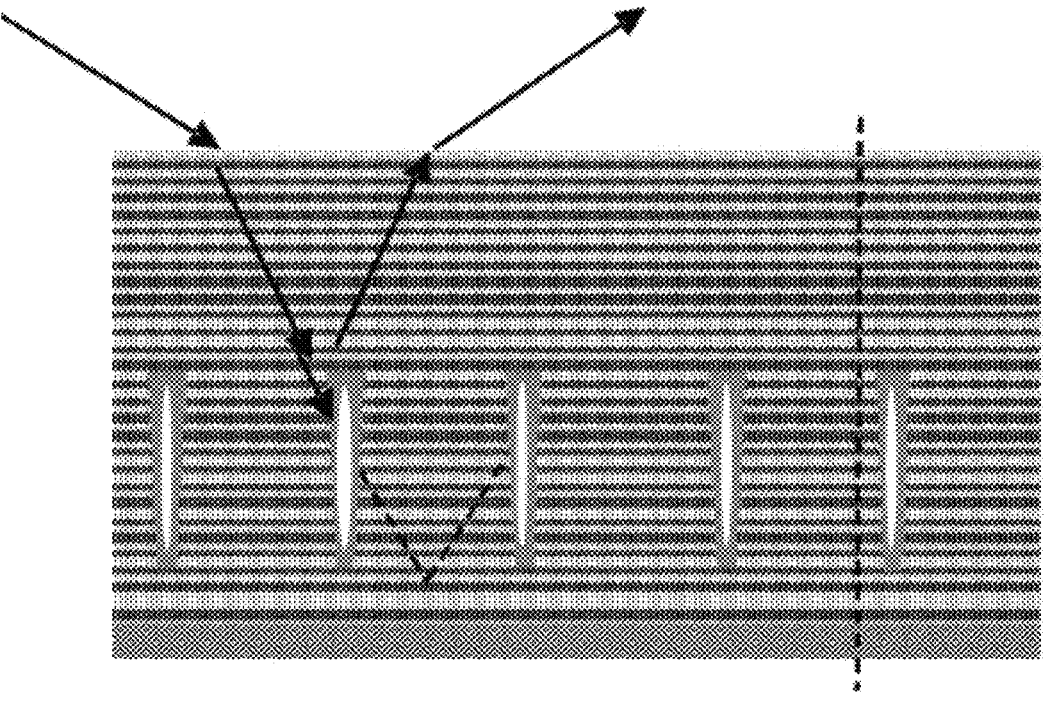
FIG. 9 shows a principle of a film thickness measurement for the 3D memory device according to the second implementation of the present disclosure.

FIG. 9 shows a principle of a film thickness measurement for the 3D memory device according to the second implementation of the present disclosure. As shown in FIG. 9, a signal (an optical signal with a specific wavelength range) for measuring a film is provided to the film to be measured from outside, as shown by solid arrows. The signal to pass the barrier layer will be blocked and can not be reflected back to the outside (as shown by the blocked dashed lines). The film to be measured (such as the second stack structure) has no barrier layer, and the signal can return normally (as shown by solid arrows), thereby accurately obtaining the thickness of the film to be measured.

Figure 10:
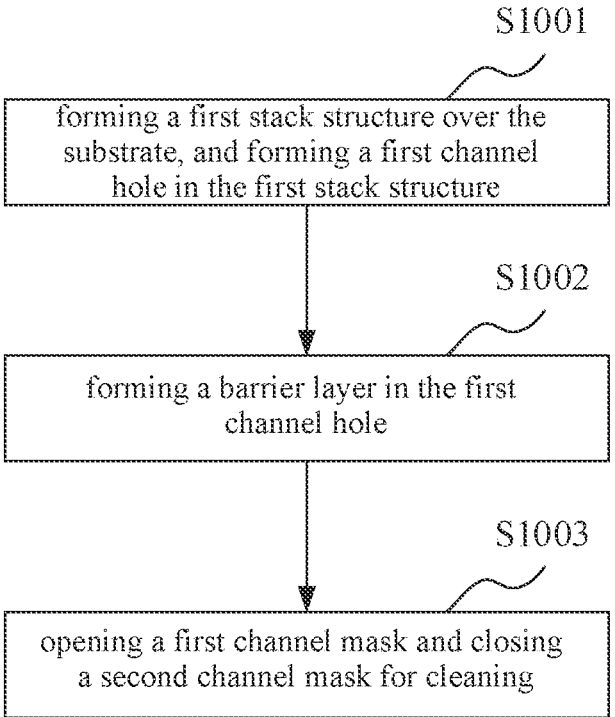
FIG. 10 shows a flow chart of a measurement method for a 3D memory device according to a third implementation of the present disclosure.

FIG. 10 shows a flow chart of a measurement method for a 3D memory device according to a third implementation of the present disclosure. As shown in FIG. 10, the measurement method for the 3D memory device according to the third implementation of the present disclosure comprises the following steps.

At Step S1001, a first stack structure is formed over a substrate; and a first channel hole is formed in the first stack structure. The first stack structure is formed over the substrate. The first channel hole penetrating through the first stack structure is formed.

At Step S1002, a barrier layer is formed in the first channel hole. The barrier layer is formed in the first channel hole. For example, a poly-Si sacrificial layer (poly-Si) and/or a carbon sacrificial layer (C) are filled in the first channel hole. The sacrificial layer filled in the first channel hole functions as the barrier layer.

At Step S1003, the first channel mask is opened, and the second channel mask is closed for cleaning.

Without any adjustment to the existing process, by controlling the measurement (pad) region mask, namely opening (developing) the first channel mask and closing (not developing) the second channel mask, the sacrificial layer (barrier layer) filled in the first channel hole is remained intact during the subsequent wet cleaning process, so that a signal within a first wavelength range (such as 190-700 nm) is blocked by the first stack structure (lower deck). With the device fabricated based on the method, while performing a film measurement, an influence of variation of the first stack structure on subsequent stack structures, such as the second stack structure may be avoided.

In an optional implementation of the present disclosure, as shown in FIGS. 6-8, the measurement method for the 3D memory device comprises: stacking a first stack structure over a substrate. The first channel mask (lower channel mask) is opened (developed) and a first channel hole is etched in the first stack structure. A second stack structure is stacked on the first stack structure and the first channel hole. The second channel mask (upper channel mask) is opened (developed), and the first channel mask is closed (not developed) to etch a second channel hole in the second stack structure. The first channel mask is opened (developed), and the second channel mask is closed (not developed) to clean the resulting part (completed device).

In the above-mentioned implementations of the present disclosure, by simply controlling the opening and closing of masks for the lower channel hole and the upper channel hole in the measurement (pad) region, the sacrificial material filled in the lower channel hole in the measurement (pad) region remains after the subsequent removing (cleaning) process. The formed barrier layer physically isolates the influence of the bottom structure on the present site being measured, because its strong absorption characteristic for light within a short (first) band makes it impossible for the signal propagating downward to the bottom structure to return to a sensor.

According to yet another aspect of the present disclosure, a film measurement device is provided for thickness measurement of the 3D memory device, as mentioned above. The film measurement device comprises an optics critical dimension (OCD) measurement device for measuring a film to be measured of the 3D memory device to obtain a measurement spectrum; and a processor for obtaining the thickness of the film to be measured according to the measurement spectrum. Optionally, the processor is connected to the OCD measurement device to receive the measurement spectrum. FIG. 9 illustrates the measurement principle of the film measurement device.

In an optional implementation of the present disclosure, a plurality of channel holes are formed in the stack structure, and barrier layers are formed in at least two channel holes. The film measurement device calculates an incident angle of measurement signal according to the spacing between adjacent barrier layers. Optionally, the plurality of channel holes are arranged in an array. Optionally, the plurality of barrier layers are arranged in an array in the stack structure.

In an optional implementation of the present disclosure, the location of channel structure (hole) is selected as the incident location of the measurement signal. Optionally, the plurality of channel holes are arranged in an array, and a barrier layer is formed in each channel hole.

Figure 11:
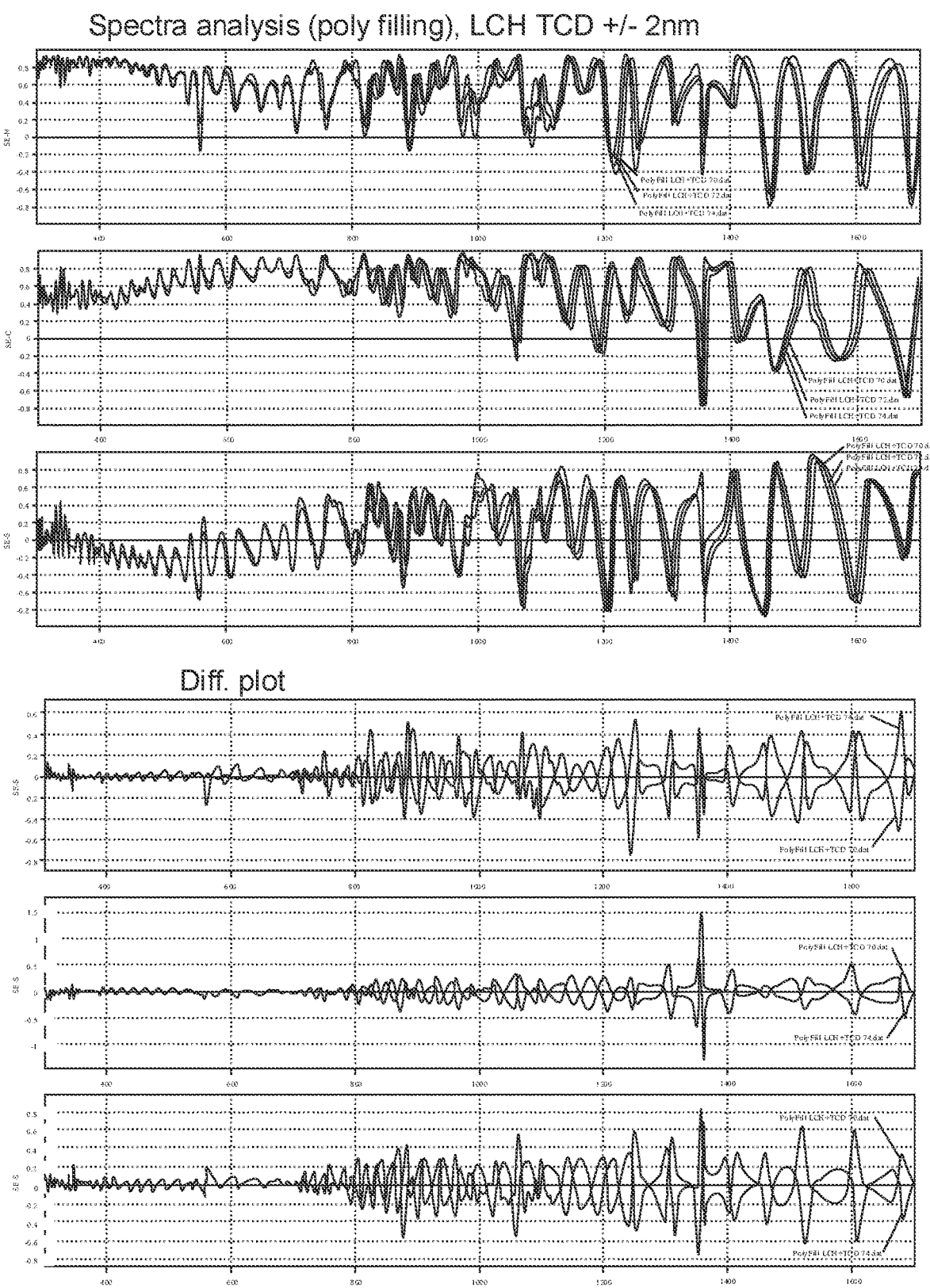
FIG. 11 shows a schematic diagram of a simulation result of a 3D memory device according to an implementation of the present disclosure.

FIG. 11 shows a schematic diagram of a simulation result of a 3D memory device according to an implementation of the present disclosure. As shown in FIG. 11, as can be seen from the OCD simulation result, the influence of CD variation in the lower channel hole (LCH) filled with the sacrificial layer (barrier layer) on the spectrum less than 700 nm is reflected as a smaller SNR (signal to noise ratio), which approaches a noise level. That is, the variation in the LCH structure filled with the sacrificial layer has little influence on the subsequent measurement. For example, graphs in FIG. 11 represent simulation results of Poly-Si Fill LCH+TCD 70.dat, Poly-Si Fill LCH+TCD 72.dat, and Poly-Si Fill LCH+TCD 74.dat, respectively.

It should be noted that, in the present description, terms such as first, second, etc., are used only to differentiate one entity or operation from another entity or operation rather than necessarily requiring or implying that there is any actual relationship or order among these entities or operations. Further, terms "include," "comprise" or any other variants thereof are intended to encompass non-exclusive inclusion such that a process, method, article, or device including a series of elements comprises not only those elements, but also other elements that have not been listed explicitly, or further comprises elements inherent in the process, method, article or device. Without any further limitations, an element defined by expression "comprising a . . . " does not exclude additional identical elements in the process, method, article, or device including the element.

According to implementations of the present disclosure as described above, these implementations neither set forth all details thoroughly nor limit the present disclosure to the described specific implementations. It is obvious that many modifications and variations may be made according to the above description. These implementations have been selected and described in detail in the description to better explain the principles and practical applications of the present disclosure such that those skilled in the art can utilize the present disclosure and make modifications thereto for use based on the present disclosure well. The present disclosure is only limited by the claims and all their scope and equivalents.

What is claimed is:

1. A three-dimensional (3D) memory device, comprising:
a substrate;
a stack structure disposed over the substrate and comprising a first stack structure and a second stack structure over the first stack structure; and
a barrier layer disposed in each of first channel holes of the first stack structure, wherein:
the barrier layer is configured to block a signal within a wavelength range from entering the first stack structure, and a thickness of the second stack structure corresponds to a reflected portion of the signal that is reflected from the second stack structure; and
an incident angle of the signal is determined by a spacing between two adjacent barrier layers.

2. The 3D memory device of claim 1, wherein
the stack structure is located over the substrate, and the barrier layer corresponds to the first stack structure without extending into the substrate.

3. The 3D memory device of claim 1, wherein the wavelength range is within 190 nm to 700 nm.

4. The 3D memory device of claim 1, further comprising:
a second channel hole disposed in the second stack structure, wherein the second channel hole extends into the barrier layer in one of the first channel holes.

5. The 3D memory device of claim 1, wherein the barrier layer penetrates through the first stack structure.

6. The 3D memory device of claim 1, wherein the barrier layer is a sacrificial layer remaining after a front-end process.

7. The 3D memory device of claim 6, wherein a material of the sacrificial layer comprises at least one of polycrystalline silicon or carbon.

8. The 3D memory device of claim 1, further comprising:
a second channel hole disposed in the second stack structure, the second channel hole being staggered relative to one of the first channel holes.

9. The 3D memory device of claim 1, wherein the barrier layer comprises carbon.

10. The 3D memory device of claim 1, wherein:
the first stack structure further comprises a monitor pad disposed over the substrate.

11. The 3D memory device of claim 1, wherein the barrier layer is disposed on a sidewall of one of the first channel holes, without entirely extending through the first stack structure.

12. The 3D memory device of claim 1, wherein:
the barrier layer is a first barrier layer; and
the 3D memory device further comprises a second barrier layer disposed between the first stack structure and the second stack structure configured to block the signal from entering into the first stack structure.

13. The 3D memory device of claim 1, wherein:
the thickness of the second stack structure corresponds to the reflected portion of the signal that is reflected from the second stack structure having no channel hole structure.

14. The 3D memory device of claim 1, wherein the second stack structure has no barrier layer.

15. The 3D memory device of claim 1, wherein a top surface of the barrier layer is in direct contact with the second stack structure having no barrier layer.

* * * * *